(12) United States Patent
Ohta et al.

(10) Patent No.: US 8,283,675 B2
(45) Date of Patent: Oct. 9, 2012

(54) LIGHT EMITTING DEVICE

(75) Inventors: Masayuki Ohta, Osaka (JP); Takanobu Matsuo, Osaka (JP); Masahiro Konishi, Osaka (JP); Tomoshi Kimura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 281 days.

(21) Appl. No.: 12/757,352

(22) Filed: Apr. 9, 2010

(65) Prior Publication Data

US 2010/0258825 A1 Oct. 14, 2010

(30) Foreign Application Priority Data

Apr. 10, 2009 (JP) ................................. 2009-095720

(51) Int. Cl.
*H01L 27/15* (2006.01)
*H01L 29/06* (2006.01)
*H01L 31/00* (2006.01)

(52) U.S. Cl. ...................... 257/79; 257/13; 257/E31.129

(58) Field of Classification Search .................... 257/79, 257/13, E31.129
See application file for complete search history.

(56) References Cited

U.S. PATENT DOCUMENTS

| 6,274,890 | B1 | 8/2001 | Oshio et al. |
| 6,914,267 | B2 | 7/2005 | Fukasawa et al. |
| 2004/0188700 | A1* | 9/2004 | Fukasawa et al. ............. 257/100 |
| 2006/0043402 | A1* | 3/2006 | Suehiro et al. .................. 257/99 |
| 2010/0038662 | A1* | 2/2010 | Fushimi et al. ................. 257/98 |

FOREIGN PATENT DOCUMENTS

| JP | 2001-7405 | 1/2001 |
| JP | 3492178 | 11/2003 |
| JP | 2004-356116 | 12/2004 |

\* cited by examiner

*Primary Examiner* — Long Tran
(74) *Attorney, Agent, or Firm* — Nixon & Vanderhye, P.C.

(57) ABSTRACT

There is provided a light emitting device which makes it possible to reduce optical loss and improve brightness by increasing a ratio of fluorescent light that is not reabsorbed by a light emitting element while decreasing a ratio of scattered light that is reabsorbed by the light emitting element. Individual faces forming outer faces of the light emitting element 2 are in contact with a bonding member 3 or sealing member 4. The bonding member 3 and the sealing member 4 contain a fluorophor. Emitted light emitted from the faces of the light emitting element 2 is transformed into fluorescent light by the fluorophor. Therefore, the ratio of scattered light that is not transformed from the emitted light into the fluorescent light can be decreased while the ratio of fluorescent light is increased.

9 Claims, 9 Drawing Sheets

LIGHT EMITTING DEVICE

TECHNICAL FIELD

The technology disclosed herein relates to a light emitting device which is used, for example, as an illumination light source or a backlight light source and which allows a light source of a desired color to be obtained.

BACKGROUND ART

An energy-saving tendency in household electrical appliances has been advancing more and more against global warming and environmental problems. As an example, lighting equipment has been changing from incandescent lamps of higher luminous efficacy to fluorescent tubes. For further energy saving, products in which LEDs (Light Emitting Diodes) are used as light sources have been increasing gradually. However, quite large numbers of LED chips or large-scale LED chips are used to increase the total luminous flux as a whole light source, leading to cost increases and a high expensiveness in spite of a merit that LEDs are semipermanently usable in comparison to fluorescent tubes. This makes an obstacle to wide-spreading of those LED-incorporated products.

The luminous efficacy of LEDs as it stands has been improved to as high as 100-150 lm/W, but there are problems in cost and deficiencies in total luminous flux per price as described above, necessitating further improvement in luminous efficacy. Then, reduction of optical loss is important for the improvement of luminous efficacy.

In an LED as a conventional light emitting device, for example as shown in JP 2004-356116 A, an LED chip is mounted on an insulating substrate having anode and cathode interconnect patterns formed on its one surface, and P-side and N-side electrodes formed on the surface of the LED chip are electrically connected to the anode and cathode interconnect patterns by gold wire. The LED chip is die-bonded by transparent epoxy resin or the like.

The LED chip, which emits blue light having a peak wavelength at 450 nm, is so formed that a GaN-based semiconductor layer is stacked on a sapphire substrate while the P-side electrode and the N-side electrode are formed in opposition to each other on the surface side of the chip.

A perimeter of the LED chip is sealed by a transparent resin containing a fluorophor that, upon receiving light of the LED chip, emits yellow light having a peak wavelength at a long wavelength, for example, 525 nm.

SUMMARY

Technical Problem

However, in the conventional light emitting device, with respect to light emitted from the LED chip, since the sapphire substrate is transparent in the above-described chip structure, leakage of the emitted light of the LED chip occurs not only from a top surface of the chip but also from side faces or a back face of the LED chip.

Light directed toward the back face side is partly absorbed by interconnect patterns although depending on the material, and partly reflected so as to be returned into the LED chip and reabsorbed by an active layer or taken out from the top or side face.

Light directed toward the side faces is transformed by the fluorophor in the sealing resin into fluorescent light, or becomes scattered light without being transformed by the fluorophor. Fluorescent light or scattered light is radiated in all directions, and therefore taken outward of the sealing resin. Also, since the reflectivity of the insulating substrate is not 100%, light directed toward the insulating substrate surface undergoes an optical loss due to some transmission. Also, the light returns again to within the LED chip and, in some cases, is reabsorbed by the active layer.

As to the light directed toward the insulating substrate or the interconnect-pattern surface, its optical loss can be reduced by using materials of high reflectivity for the insulating substrate or the interconnect patterns. For example, silver (having a reflectivity of 98% for visible light) is used for the interconnect patterns, or an AlN substrate (having a reflectivity of 93% for visible light) is used for the insulating substrate.

As to the light reabsorbed by the LED chip, it has been found out that wavelengths having influence on the absorption, scattered light emitted from the LED chip and not transformed into fluorescent light is absorbed.

Also, whereas the LED chip is die-bonded by using epoxy resin as described above, this epoxy resin goes around to side faces of the LED chip, so that the side faces of the chip may not be covered directly with the sealing resin containing the fluorophor.

Due to a refractive index difference between the die-bond adhesive (e.g., epoxy resin containing no fluorophor) and the sealing resin containing the fluorophor for sealing the LED chip or other reasons, light emitted from side faces of the LED chip is reflected by an interface between the die-bond adhesive and the sealing resin so as to return as scattered light to the LED chip without being transformed into fluorescent light, and the light is reabsorbed by the LED chip. On the other hand, light that is emitted from side faces of the LED chip and directed toward the substrate is not scattered within the die-bond adhesive (e.g., epoxy resin containing no fluorophor) in the side faces of the LED chip, and directed toward the substrate as it is so as to be reflected in most part. However, as already described above, since the reflectivity of the substrate is not 100%, it has been found out from experiments or the like that there is an optical loss due to some transmission.

Accordingly, an object of the technology disclosed herein is to provide a light emitting device in which the optical loss can be reduced by increasing the ratio of fluorescent light that is not reabsorbed by a light emitting element while decreasing the ratio of scattered light that is reabsorbed by the light emitting element, so that the brightness can be improved.

Solution to Problem

In order to achieve the above object, the technology disclosed herein provides a light emitting device comprising:
a substrate;
a light emitting element placed on the substrate;
a bonding member, having light transmitting property, for fixing the light emitting element to the substrate; and
a sealing member for sealing the light emitting element and the bonding member, the sealing member having light transmitting property and containing a fluorophor, wherein
a fluorophor-containing area containing the fluorophor is placed so as to be in contact with faces except a substrate-side lower face out of individual faces forming outer faces of the light emitting element and moreover in contact or out of contact with the substrate-side lower face of the light emitting element, and the fluorophor is excited by emitted light of the light emitting element to emit fluorescent light longer in wavelength than the emitted light.

According to the light emitting device of the technology disclosed herein, since the fluorophor-containing area is placed so as to be in contact with faces except the substrate-side lower face out of the individual faces forming outer faces of the light emitting element and moreover in contact or out of contact with the substrate-side lower face of the light emitting element, emitted light emitted from the faces of the light emitting element is promptly transformed into fluorescent light by the fluorophor of the fluorophor-containing area. Therefore, while the ratio of fluorescent light transformed by the fluorophor out of emitted light from the light emitting element is increased, the ratio of scattered light that is not transformed from the emitted light into the fluorescent light can be decreased.

Thus, it becomes possible to decrease the ratio of scattered light reabsorbed by the light emitting element while increasing the ratio of fluorescent light that is not reabsorbed by the light emitting element, by which the optical loss can be reduced and the brightness can be improved.

In one embodiment, the bonding member contains the fluorophor and corresponds to part of the fluorophor-containing area, and
the bonding member is in contact with the substrate-side lower face of the light emitting element and side faces of the light emitting element.

According to the light emitting device of this embodiment, the bonding member contains the fluorophor and corresponds to part of the fluorophor-containing area, and the bonding member is in contact with the lower face and side faces of the light emitting element. Therefore, the bonding member can be used for both roles of bonding the light emitting element and transforming the emitted light of the light emitting element into the fluorescent light. Thus, it becomes possible to increase the ratio of light forming the fluorescent light out of emitted light from the light emitting element to thereby decrease the ratio of scattered light, by which the optical loss can be reduced and the brightness can be improved.

In one embodiment, the light emitting element is provided in a plurality, and
the plurality of light emitting elements are placed on the single substrate and sealed by the single sealing member.

According to the light emitting device of this embodiment, since the plurality of light emitting elements are placed on the single substrate, the brightness can be improved corresponding to the plurality of light emitting elements. Moreover, since the plurality of light emitting elements are sealed by the single sealing member, there does not occur refraction or reflection at the interface as compared with cases in which sealing is done by a plurality of sealing members so that there occur refraction and reflection at their interface. Thus, the brightness can be improved.

In one embodiment, a distance between adjacent ones of the light emitting elements is 100 μm to 200 μm.

According to the light emitting device of this embodiment, since the distance between adjacent ones of the light emitting elements is 100 μm to 200 μm, a small size reduction and brightness improvement of the device can be achieved. In contrast to this, if the distance is less than 100 μm, then the volume of the fluorophor-containing bonding member between adjacent light emitting elements decreases, so that the ratio of fluorescent light decreases, leading to decreases in the brightness. On the other hand, if the distance d is over 200 μm, then the quantity of the light emitting elements placed on the single substrate decreases, so that the brightness decreases.

In one embodiment, a gold electrode electrically connected to the light emitting element is provided on the substrate.

According to the light emitting device of this embodiment, since the gold electrode of high reflectivity is provided on the substrate, emitted light from the light emitting element can be reflected by the gold electrode of high reflectivity, so that the brightness can be improved.

In one embodiment, the substrate has a groove in its face opposed to the light emitting element, the groove having a longitudinal length larger than a length of a bottom face of the light emitting element in the longitudinal direction of the groove and moreover the groove being partly out of coverage with the bottom face of the light emitting element.

According to the light emitting device of this embodiment, since the substrate has the groove in its face opposed to the light emitting element, emitted light from the light emitting element can be taken out from the substrate-side lower face of the light emitting element via the groove, so that the brightness can be improved.

In one embodiment, the bonding member is placed in the groove.

According to the light emitting device of this embodiment, since the bonding member is placed in the groove, the light emitting element can be strongly fixed to the substrate. Also, when the bonding member contains the fluorophor, the emitted light can be transformed into fluorescent light by the fluorophor-containing bonding member provided in the groove, so that the ratio of fluorescent light can be increased and the brightness can be improved.

In one embodiment, the substrate has, in its light emitting element-side surface, an overlapping portion coinciding and overlapping with the light emitting element, and grooves are provided outside at least one pair of opposite sides of the overlapping portion, and
the bonding members are placed within the grooves, and the bonding member does not contain the fluorophor.

According to the light emitting device of this embodiment, since the bonding member that does not contain the fluorophor is placed in the groove of the substrate, the volume of the bonding member can be absorbed by the groove, so that crawl-up of the bonding member onto the side faces of the light emitting element can be prevented. Thus, while the ratio of the fluorescent light that is not reabsorbed by the light emitting element is increased, the ratio of the scattered light that is reabsorbed by the light emitting element can be decreased. As a consequence, this light emitting device is high in brightness.

In one embodiment, the overlapping portion of the substrate contains the fluorophor and corresponds to part of the fluorophor-containing area.

According to the light emitting device of this embodiment, since the overlapping portion of the substrate contains the fluorophor and corresponds to part of the fluorophor-containing area, the substrate can be used for both roles of supporting the light emitting element and transforming the emitted light of the light emitting element into the fluorescent light. As a consequence, this light emitting device is high in brightness.

In one embodiment, a resin which is a component element of the bonding member and a resin which is a component element of the sealing member are equal in refractive index to each other.

According to the light emitting device of this embodiment, since the resin of the bonding member and the resin of the sealing member are equal in refractive index each other, there occurs neither refraction nor reflection at the interfaces of the bonding member and the sealing member, so that the optical loss can be reduced. As a consequence, this light emitting device is high in brightness.

Advantageous Effects

According to the light emitting device of the technology disclosed herein, since the fluorophor-containing area is placed so as to be in contact with faces except the substrate-side lower face out of the individual faces forming outer faces of the light emitting element and moreover in contact or out of contact with the substrate-side lower face of the light emitting element, it becomes possible to decrease the ratio of scattered light that is reabsorbed by the light emitting element while increasing the ratio of fluorescent light that is not reabsorbed by the light emitting element, so that the optical loss can be reduced and the brightness can be improved.

BRIEF DESCRIPTION OF DRAWINGS

The technology disclosed herein will become more fully understood from the detailed description given hereinbelow and the accompanying drawings which are given by way of illustration only, and thus are not intended to limit the technology disclosed herein, and wherein.

DESCRIPTION OF EMBODIMENTS

Hereinbelow, the technology disclosed herein will be described in detail by way of embodiments thereof illustrated in the accompanying drawings.

First Embodiment

Figure 1A:
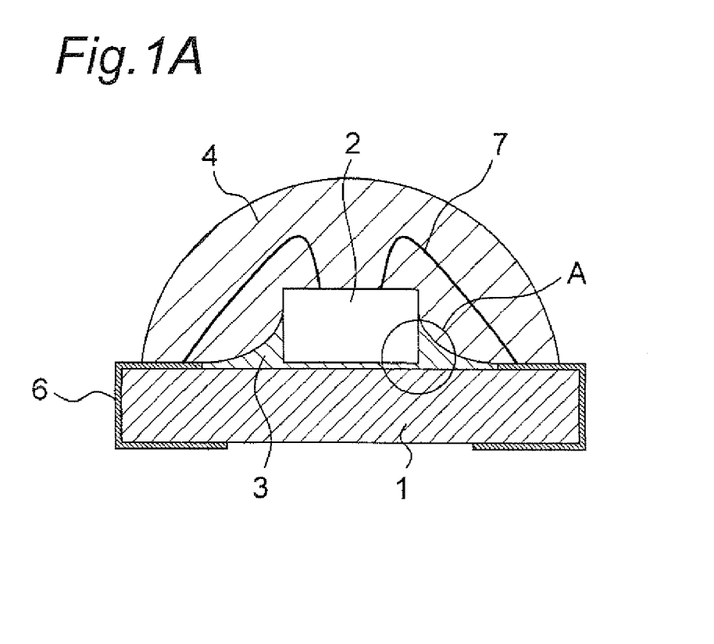
FIG. 1A is a sectional view showing a first embodiment of a light emitting device according to the technology disclosed herein.
Figure 1B:
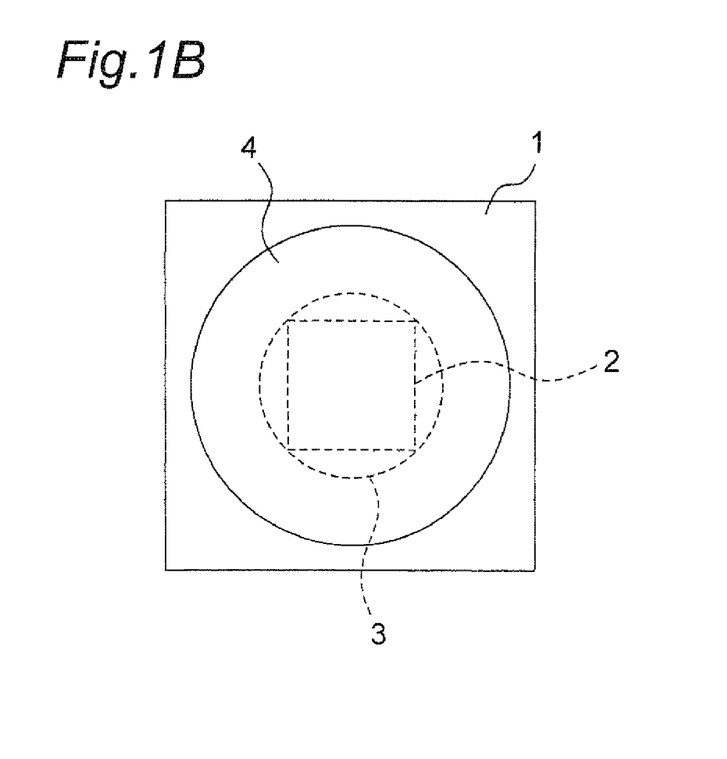
FIG. 1B is a plan view of the light emitting device.

FIG. 1A is a sectional view showing a first embodiment of a light emitting device according to the technology disclosed herein. FIG. 1B is a plan view of the light emitting device. It is noted that a gold electrode 6 of FIG. 1A is omitted for illustration in FIG. 1B.

As shown in FIGS. 1A and 1B, the light emitting device is to be used as an illumination light source or a backlight light source, and allows a light source of a desired color to be obtained.

This light emitting device includes a substrate 1, a light emitting element 2 placed on the substrate 1, a bonding member 3 for fixing the light emitting element 2 on the substrate 1, and a sealing member 4 for sealing the light emitting element 2 and the bonding member 3.

The substrate 1 is made from, for example, epoxy resin containing glass fiber. The light emitting element 2 is, for example, a blue LED element.

The bonding member 3, having light transmitting property, is made from, for example, epoxy resin containing fluorophor. The sealing member 4, having light transmitting property, is made from, for example, epoxy resin containing fluorophor. The epoxy resin of the bonding member 3 and the epoxy resin of the sealing member are equal in refractive index to each other. As a result, there occurs neither reflection nor refraction at an interface between the epoxy resin of the bonding member 3 and the epoxy resin of the sealing member 4, so that the optical loss is reduced.

On the substrate 1 is provided a gold electrode 6 which is electrically connected to the light emitting element 2. An electrode provided on a top face of the light emitting element 2 is connected to the gold electrode 6 via a wire 7. This gold electrode 6 has quite a high reflectivity as much as over 98% for visible light.

The bonding member 3 is put into contact with an entirety of a substrate 1 side lower face (referred to also as back face or bottom face) of the light emitting element 2 as well as with part of side faces of the light emitting element 2. It is noted that the bonding member 3 may cover the individual whole side faces of the light emitting element 2. Further, the bonding member 3 may cover the individual whole side faces of the light emitting element 2 as well as peripheries of the top face of the light emitting element 2, where a wire-bond area for the P-side and N-side electrodes provided on the top face of the light emitting element 2 should be avoided.

The epoxy resin of the bonding member 3 is preferably of high thixotropy and to be formed into a hemispherical shape when applied onto the substrate 1 by a dispenser. The light emitting element 2 is brought by its own weight into a somewhat buried state into the bonding member 3, making it easily achievable to cover up to the side faces of the light emitting element 2 with epoxy resin.

The fluorophor is added to the bonding member 3 at an addition amount limited by a specified upper limit so that the bond strength does not deteriorate.

The sealing member 4 is brought into contact with the entirety of the top face of the light emitting element 2 as well as part of the individual side faces of the light emitting element 2. That is, the sealing member 4 is brought into contact with faces of the light emitting element 2 with which the bonding member 3 is not in contact.

The refractive index of a resin layer which is a component element of the sealing member 4 is equal to the refractive index of a resin layer which is a component element of the bonding member 3 as described above, so that reflection does not occur at an interface of those two resin layers. The sealing member 4 contains a fluorophor, which is the same as the fluorophor of the bonding member 3.

The light emitting element 2 is shaped into, for example, a hexahedron having a square plan view, and each of outer faces of the light emitting element 2 is at least partly in contact with a fluorophor-containing area where the fluorophor is contained. That is, the bonding member 3 corresponds to part of the fluorophor-containing area, and the sealing member 4 corresponds to part of the fluorophor-containing area. The fluorophor-containing area is in contact with the individual faces of the light emitting element 2 so as to surround the perimeter of the light emitting element 2. It is noted that the planar shape of the light emitting element 2 may be formed into a rectangular, circular, elliptical or other shape instead of the square shape.

The fluorophor is, for example, a YAG-related yellow fluorophor, BOSE-related yellow fluorophor, red fluorophor, or green fluorophor. This fluorophor is excited by emitted light of the light emitting element 2 to radiate fluorescent light longer in wavelength than the emitted light.

Figure 2:
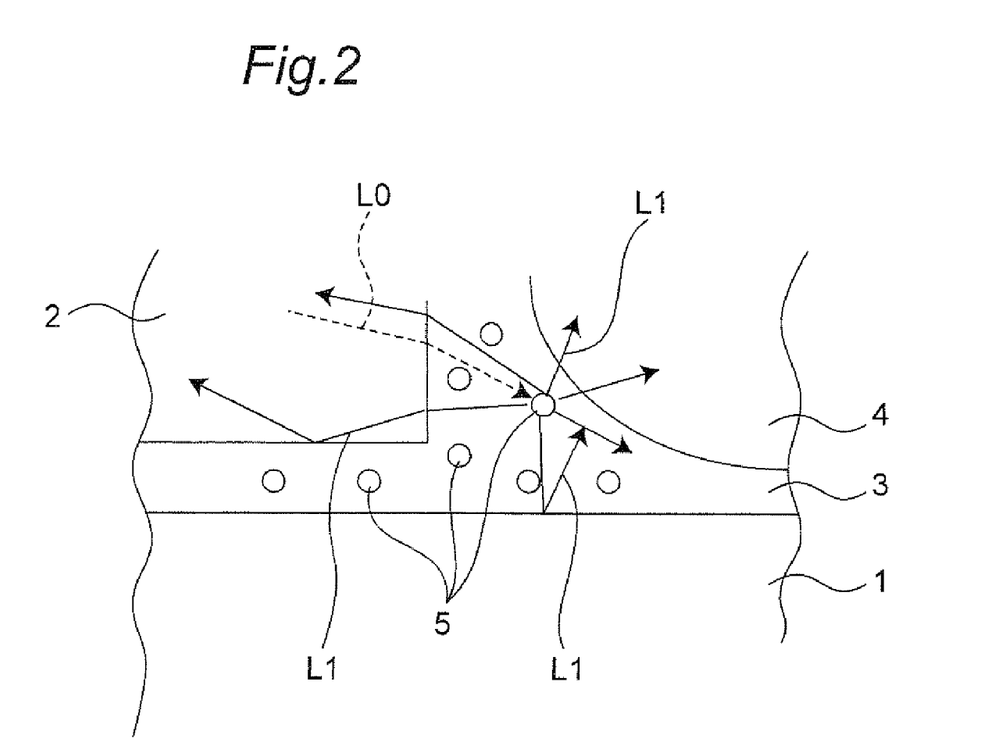
FIG. 2 is an enlarged view of a portion A of FIG. 1A.

Then, as shown in FIG. 2, emitted light L0 (indicated by arrow in broken line) emitted from the individual faces of the light emitting element 2 is transformed into fluorescent light L1 (indicated by arrow in solid line) by the fluorophor 5. Since almost all of the individual faces of the light emitting element 2 are in contact with the bonding member 3 and the sealing member 4 both containing the fluorophor 5, it becomes possible to decrease the ratio of scattered light that is not transformed from the emitted light L0 into the fluorescent light L1 while increasing the ratio of the fluorescent light L1.

Accordingly, the ratio of scattered light that is reabsorbed by the light emitting element 2 can be decreased while the ratio of the fluorescent light L1 that is not reabsorbed by the light emitting element 2 is increased, thus making it possible to reduce the optical loss and improve the brightness.

Further, the bonding member 3, which corresponds to part of the fluorophor-containing area, is brought into contact with the lower face and side faces of the light emitting element 2. Therefore, the bonding member 3 can be used for both roles of bonding the light emitting element 2 and transforming the emitted light L0 of the light emitting element 2 into the fluorescent light L1. Thus, the brightness can be improved.

Also, since the gold electrode 6 is provided on the substrate 1, the emitted light L0 from the light emitting element 2 can be reflected by the gold electrode 6, so that the brightness can be improved.

Second Embodiment

Figure 3:
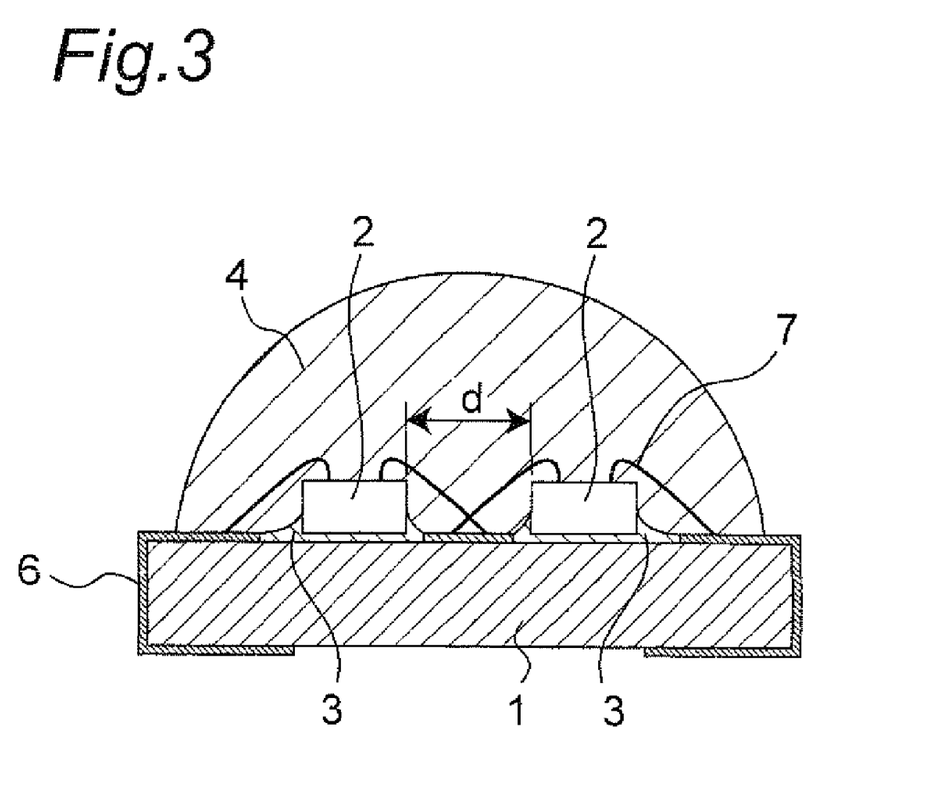
FIG. 3 is a sectional view showing a second embodiment of a light emitting device according to the technology disclosed herein.

FIG. 3 shows a second embodiment of the light emitting device of the technology disclosed herein. As a difference from the first embodiment, the second embodiment has a plurality of light emitting elements. In FIG. 3, which shows the second embodiment, the same component members as in the first embodiment shown in FIGS. 1A and 1B are designated by the same reference signs as those of FIGS. 1A and 1B, and their detailed description is omitted.

As shown in FIG. 3, a plurality of light emitting elements 2, 2 are placed on a single substrate 1 and sealed by a single sealing member 4. A distance d between adjacent light emitting elements 2, 2 is 100 μm to 200 μm.

Accordingly, since the plurality of light emitting elements 2, 2 are placed on the single substrate 1, the brightness can be improved corresponding to the plurality of light emitting elements 2. Also, since the plurality of light emitting elements 2, 2 are sealed by the single sealing member 4, reflection and refraction at the interface between the layers are not involved as compared with cases in which a plurality of sealing members are used for multilayer sealing, so that less optical loss is involved and therefore the brightness can be improved. Thus, quite large improvement in brightness can be achieved by combinational effects of the improvement of brightness corresponding to the plurality of light emitting elements 2, 2 enabled by placement of the plurality of light emitting elements 2, 2 on the single substrate 1, and the elimination of refraction and reflection between the layers enabled by the sealing of the plurality of light emitting elements 2, 2 with the single sealing member 4.

Besides, since the distance d between adjacent light emitting elements 2, 2 is 100 μm to 200 μm, a small size as well as brightness improvement can be achieved. In contrast to this, if the distance d is less than 100 μm, then the volume (thicknesses) of the bonding member 3 between the adjacent light emitting elements 2, 2 decreases, so that the ratio at which light emitted from the light emitting elements 2 is transformed into fluorescent light by the fluorophor contained in the bonding member 3 decreases, leading to increases in the loss of reabsorption by the light emitting elements 2 and therefore decreases in the brightness. On the other hand, if the distance d is over 200 μm, then the quantity of the light emitting elements 2 placed on the single substrate 1 has to be decreased, or the size of the light emitting device as a whole is inevitably increased.

Third Embodiment

Figure 4A:
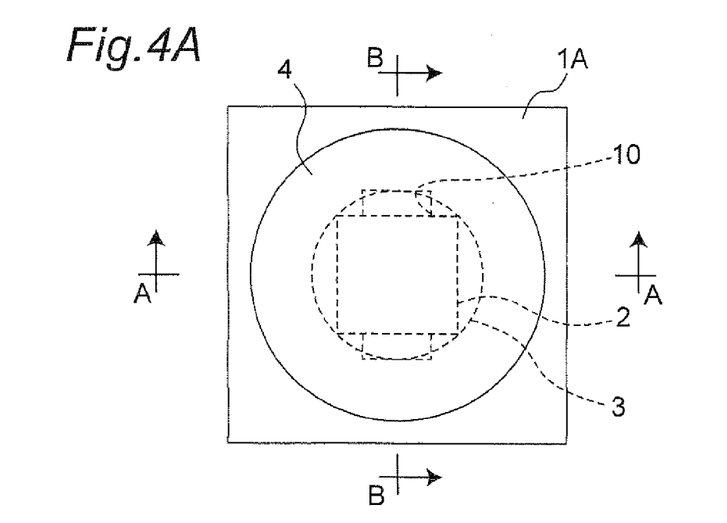
FIG. 4A is a plan view showing a third embodiment of a light emitting device according to the technology disclosed herein.
Figure 4B:
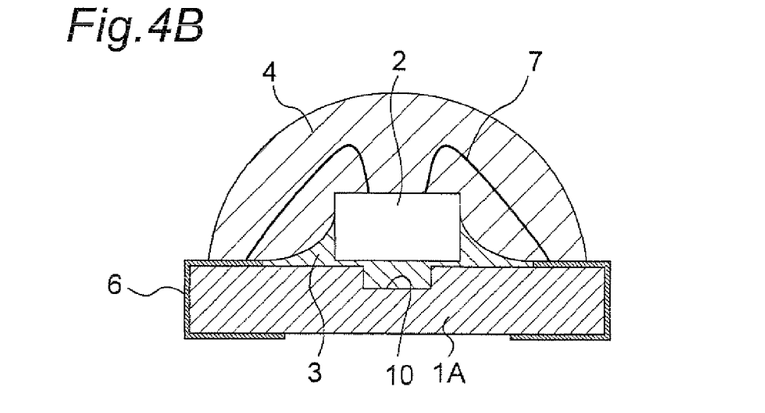
FIG. 4B is a sectional view taken along a line A-A of FIG. 4A.
Figure 4C:
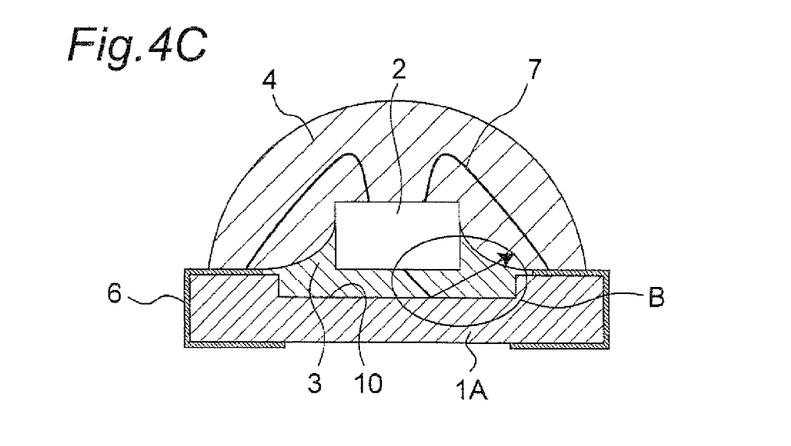
FIG. 4C is a sectional view taken along a line B-B of FIG. 4A.

FIGS. 4A, 4B and 4C show a third embodiment of the light emitting device of the technology disclosed herein. The third embodiment differs from the first embodiment in the substrate structure. In FIGS. 4A, 4B and 4C of this third embodiment, the same component members as in the first embodiment shown in FIGS. 1A and 1B are designated by the same reference signs as those of FIGS. 1A and 1B, and their detailed description is omitted.

As shown in FIGS. 4A, 4B and 4C, a substrate 1A has, in its surface facing the light emitting element 2, a groove 10 having a rectangular-shaped cross section. In this groove 10, the bonding member 3 is placed. It is noted that the gold electrode 6 is omitted for illustration in FIG. 4A. In addition, the cross-sectional shape of the groove 10 may also be a semicircular, V or U shape or the like, instead of a rectangular one.

A longitudinal length of the groove 10 is larger than a length of the bottom face of the light emitting element 2 in the longitudinal direction of the groove 10, and both end portions of the groove 10 are exposed without being covered with the bottom face of the light emitting element 2. That is, the groove 10, which is formed long and narrow, has a longitudinal length larger than the length of the light emitting element 2 having a generally square plan view and a lateral length smaller than the length of the light emitting element 2. That is, when viewed from the top face of the light emitting element 2, the light emitting element 2 stretches over the groove 10 in the lateral direction of the groove 10, and the groove 10 is exposed from the light emitting element 2 in both end portions in the longitudinal direction of the groove 10. It is noted that the quantity of the grooves 10 may be one or some plurality. Also, although both end portions of the groove 10 are exposed from the light emitting element 2 in FIG. 4A, it is also allowable that only one end portion of the groove (not shown) is exposed from the light emitting element 2.

The bonding member 3 is filled into the groove 10 and moreover applied also to portions on the substrate 1A in vicinities of peripheries of the groove 10. The substrate 1A is made from, for example, a material of high reflectivity for visible light. Such a material is exemplified by AlN or the like.

Figure 5:
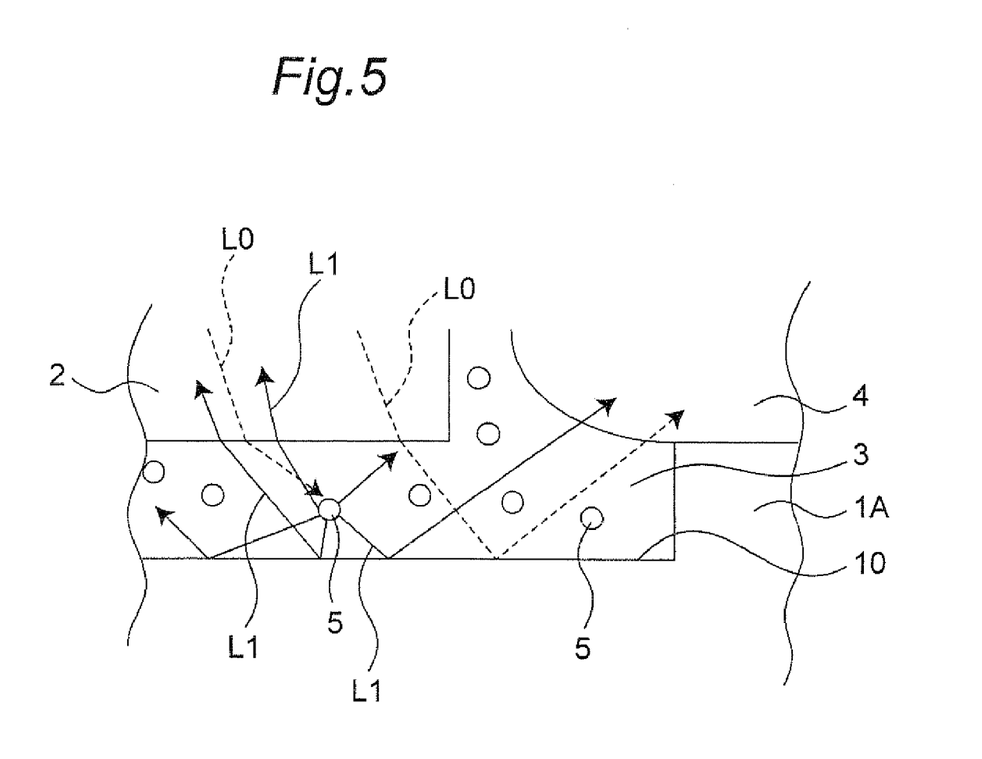
FIG. 5 is an enlarged view of a portion B of FIG. 4C.

Then, as shown in FIG. 5, part of emitted light L0 emitted from the lower face of the light emitting element 2 is transformed into fluorescent light L1 by the fluorophor 5 of the bonding member 3 filled in the groove 10. This fluorescent light L1 is reflected by an inner surface of the groove 10, and part of the reflected light returns to the light emitting element 2 while the other portion of the reflected light is taken outside from the groove 10. The fluorescent light L1 that has returned to the light emitting element 2 is not absorbed but reflected by the light emitting element 2, thus being taken outside. Also, the fluorescent light L1 transformed by the fluorophor 5 is reflected by the surface of the substrate 1A so as to be taken outside. Thus, the fluorescent light L1 is taken outside in the end.

Consequently, since the substrate 1A has the groove 10 in the surface facing the light emitting element 2, the emitted light L0 of the light emitting element 2 can be taken out from the substrate LA side lower face of the light emitting element 2 via the groove 10, so that the brightness can be improved.

Further, since the bonding member 3 is placed in the groove 10, the light emitting element 2 can be fixed strongly to the substrate 1A.

Fourth Embodiment

Figure 6:
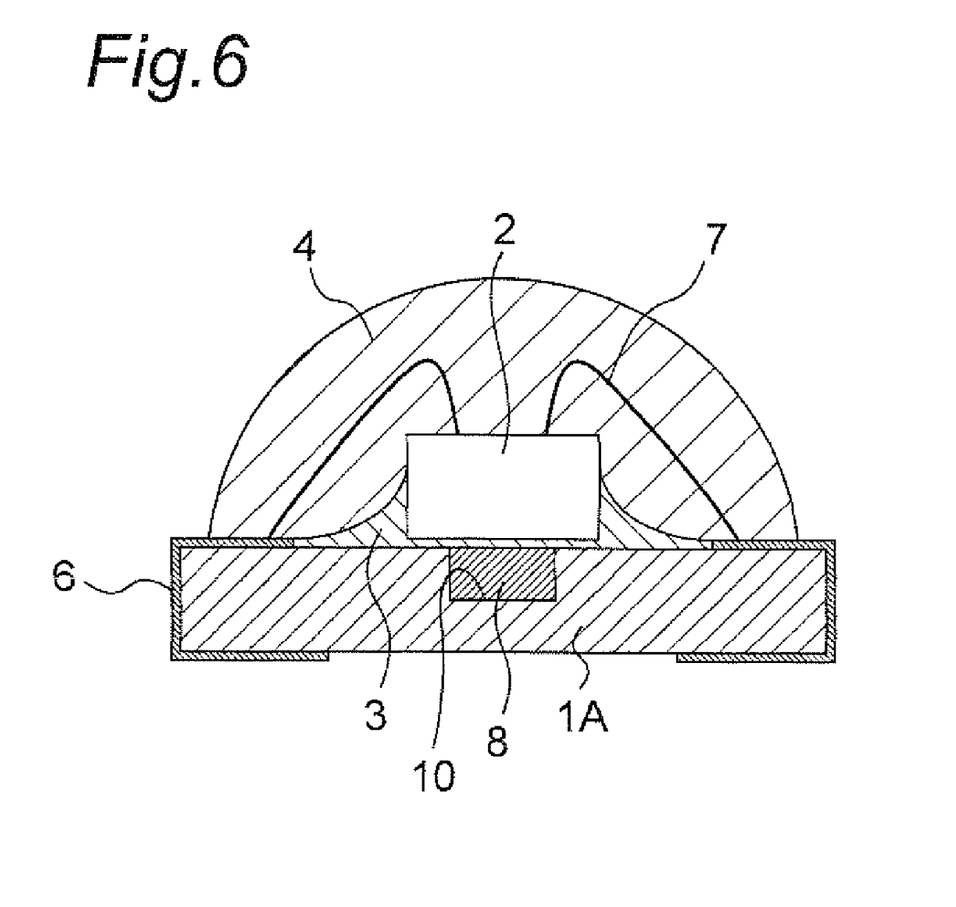
FIG. 6 is a sectional view showing a fourth embodiment of a light emitting device according to the technology disclosed herein.

FIG. 6 shows a fourth embodiment of the light emitting device of the technology disclosed herein. The fourth embodiment differs from the third embodiment in the resin to be filled in the groove of the substrate. In FIG. 6 of this fourth embodiment, the same component members as in the third embodiment shown in FIGS. 4A, 4B and 4C are designated by the same reference signs as those of FIGS. 4A, 4B and 4C, and their detailed description is omitted.

As shown in FIG. 6, not the bonding member 3 but a resin portion 8 is filled in the groove 10 of the substrate 1A. This resin portion 8, containing no fluorophor, is made from, for example, transparent epoxy resin.

Accordingly, the resin portion 8 can be filled into the groove 10 in advance when there is difficulty in filling the bonding member 3 into the groove 10. Also, the filling of the resin portion 8 makes it possible to prevent deterioration of the bond strength due to thermal distortion of the bonding member 3.

Fifth Embodiment

Figure 7:
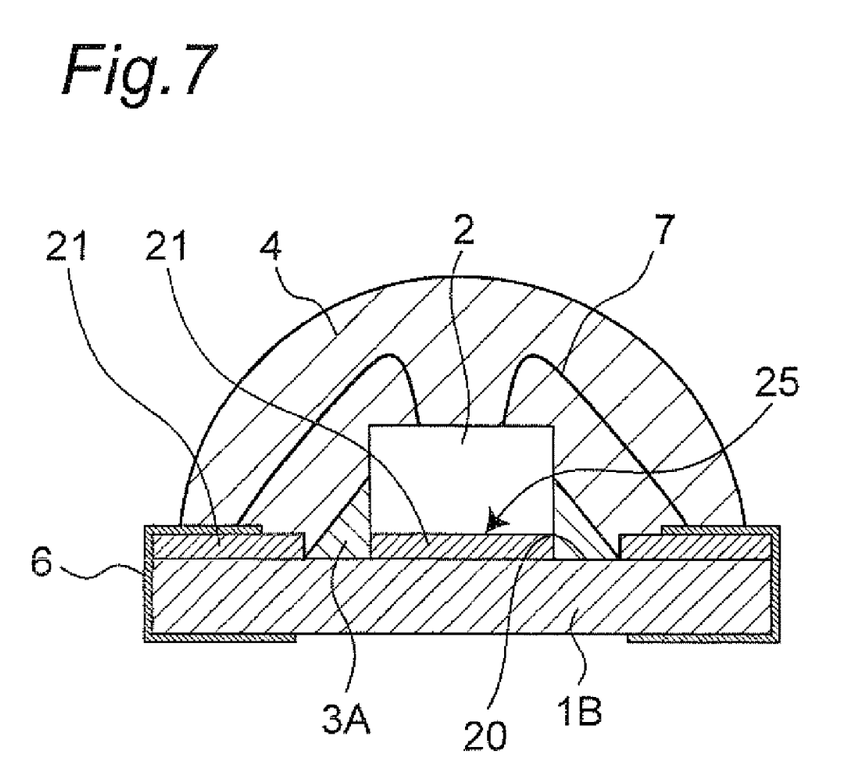
FIG. 7 is a sectional view showing a fifth embodiment of a light emitting device according to the technology disclosed herein.

FIG. 7 shows a fifth embodiment of the light emitting device of the technology disclosed herein. The fifth embodiment differs from the first embodiment in the substrate structure. In FIG. 7 of this fifth embodiment, the same component members as in the first embodiment shown in FIGS. 1A and 1B are designated by the same reference signs as those of FIGS. 1A and 1B, and their detailed description is omitted.

As shown in FIG. 7, a substrate 1B has an overlapping portion 25 that coincides and overlaps with the light emitting element 2 in its one surface on the light emitting element 2 side. The overlapping portion 25 is rectangular-shaped in a plan view. Outside a pair of opposite sides of the overlapping portion 25 is provided a groove 20. The groove 20 may also be provided outside at least one pair of opposite sides of the overlapping portion 25.

Within the groove 20, a bonding member 3A is placed. This bonding member 3A, containing no fluorophor 5, is made from epoxy resin.

The bonding member 3A is low in thixotropy. Therefore, when the bonding member 3A is applied to the overlapping portion 25 and the light emitting element 2 is mounted thereon, any excess bonding member 3A that has overflowed from the lower face of the light emitting element 2 falls into the groove 20 without covering the side faces of the light emitting element 2.

If the bonding member 3A can be made to fall into the groove 20 without covering the side faces of the light emitting element 2 and moreover if the bonding member 3A can be die-bonded stably, then the overlapping portion 25 does not have to be identical in size to the light emitting element 2 and may be more or less smaller or larger than the light emitting element 2.

The side faces of the light emitting element 2 are covered with the sealing member 4 containing the fluorophor 5. Part of emitted light emitted from the side faces of the light emitting element 2 is transformed into fluorescent light promptly by the fluorophor 5. It is noted that the resin (epoxy resin) of the bonding member 3A and the resin (epoxy resin) of the sealing member 4 are equal in refractive index for visible light to each other, so that there occurs neither reflection nor refraction at the interface, with the optical loss reduced. However, it is also possible that the resin of the bonding member 3A and the resin of the sealing member 4 are different in refractive index for visible light from each other.

A portion 21 on the surface side of the overlapping portion 25, which contains the fluorophor 5, corresponds to part of the fluorophor-containing area. The fluorophor 5 is dispersed to a certain thickness on the surface side of the substrate 1B except the groove 20. In addition, the fluorophor 5 may also be dispersed over the entire substrate 1B.

As shown above, part of the fluorophor-containing area (overlapping portion 25 and part of the sealing member 4) are put into contact with individual faces of the light emitting element 2 so as to surround peripheries of the light emitting element 2, and moreover the other portions of the fluorophor-containing area (other portions of the sealing member 4) are placed with intervals to the individual faces of the light emitting element 2 so as to surround the peripheries of the light emitting element 2.

Figure 8A:
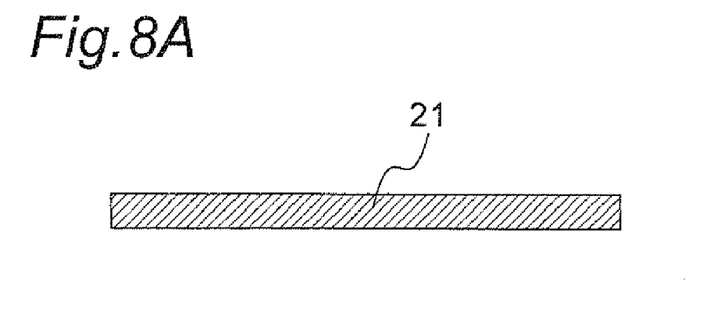
FIG. 8A is a sectional view showing a first step of a substrate manufacturing process.

As to the process for preparing the substrate 1B, a first substrate portion 21 containing the fluorophor 5 is prepared as shown in FIG. 8A. The first substrate 21 forms the above-described surface side portion 21.

Figure 8B:
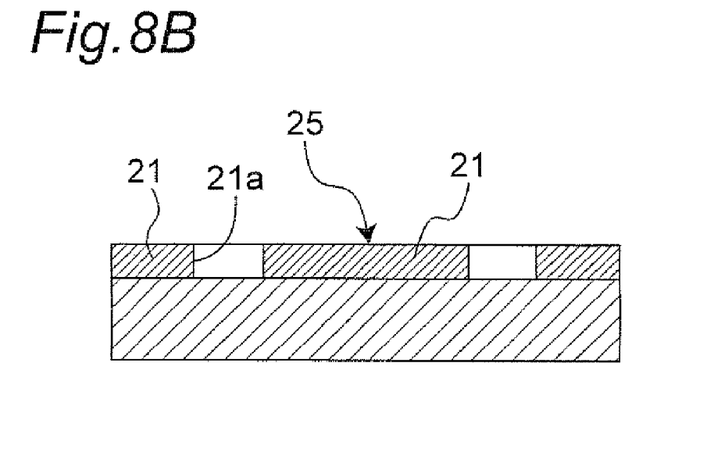
FIG. 8B is a sectional view showing a second step of the substrate manufacturing process.
Figure 9:
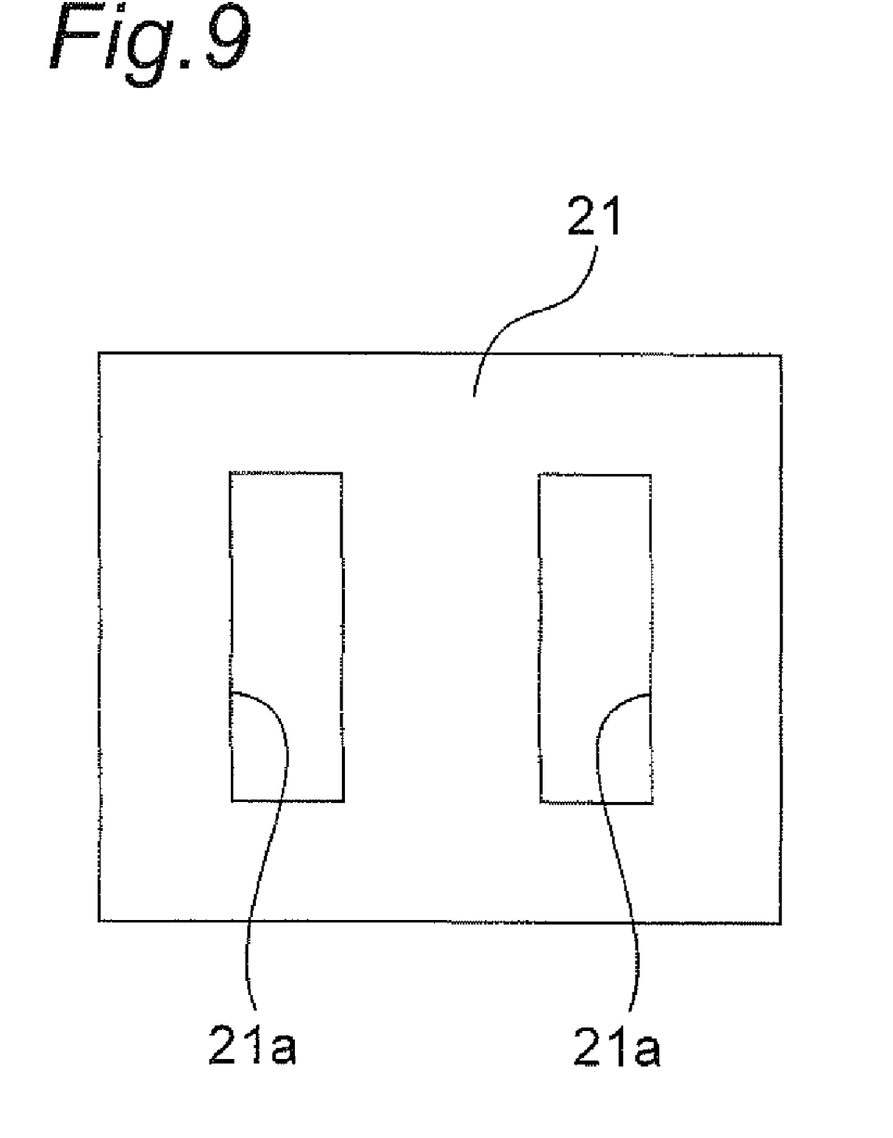
FIG. 9 is a plan view of a first substrate portion of FIG. 8B.

Then, as shown in FIGS. 8B and 9, in the first substrate portion 21, hole portions 21a, 21a are formed outside a pair of opposite sides of the overlapping portion 25 by metal-die punching.

Figure 8C:
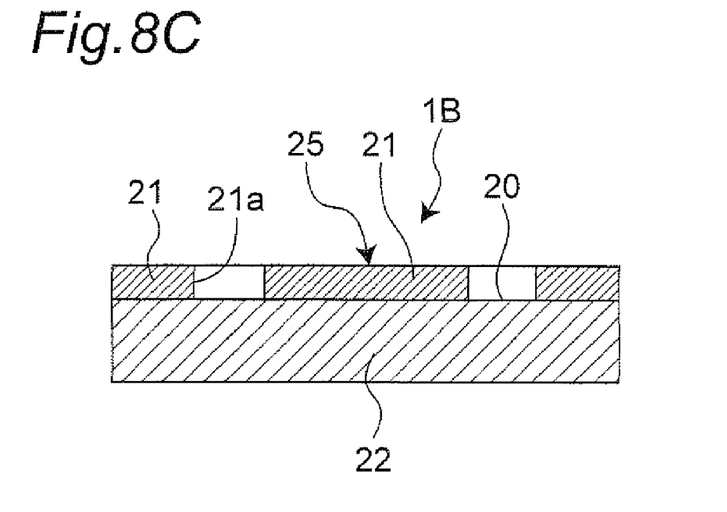
FIG. 8C is a sectional view showing a third step of the substrate manufacturing process.

Thereafter, as shown in FIG. 8C, the first substrate portion 21 is bonded and sintered to a second substrate portion 22 containing no fluorophor 5, by which the substrate 1B is made up. In this process, the groove 20 is formed by each hole portion 21a.

Accordingly, since the bonding member 3A containing no fluorophor 5 is placed within the groove 20 of the substrate 1B, the volume of the bonding member 3A can be absorbed by the groove 20, so that crawl-up of the bonding member 3A onto the side faces of the light emitting element 2 can be prevented. Thus, while the ratio of the fluorescent light L1 that is not reabsorbed by the light emitting element 2 is increased, the ratio of the scattered light that is reabsorbed by the light emitting element 2 can be decreased.

Since the overlapping portion 25 of the substrate 1B contains the fluorophor 5 and corresponds to part of the fluorophor-containing area, the substrate 1B can be used for both roles of supporting the light emitting element 2 and transforming the emitted light L0 of the light emitting element 2 into the fluorescent light L1. Thus, in this light emitting device, the brightness can be improved.

The technology disclosed herein is not limited to the above-described embodiments. For example, features of the first to fifth embodiments may be combined in various ways. Also, whereas the fluorophor-containing area is in contact with individual faces forming the outer faces of the light emitting element, the fluorophor-containing area may be so placed as to be in contact with faces except the substrate-side lower face (substrate mounting surface) out of the individual faces forming the outer faces of the light emitting element with a spacing from the substrate-side lower face (substrate mounting surface) of the light emitting element.

Embodiments of the technology disclosed herein being thus described, it will be obvious that the same may be varied in many ways. Such variations are not to be regarded as a departure from the spirit and scope of the technology disclosed herein, and all such modifications as would be obvious to one skilled in the art are intended to be included within the scope of the following claims.

REFERENCE SIGNS LIST 1, 1A, 1B substrate
2 light emitting element
3, 3A, bonding member
4 sealing member
5 fluorophor
6 gold electrode
7 wire
8 resin portion
10 groove
20 groove
21 first substrate portion
21a hole portion
22 second substrate portion
25 overlapping portion
L0 emitted light
L1 fluorescent light
d distance between adjacent light emitting elements

The invention claimed is:

1. A light emitting device, comprising:
a substrate;
a light emitting element placed on the substrate;
a bonding member, having light transmitting property, for fixing the light emitting element to the substrate; and
a sealing member for sealing the light emitting element and the bonding member, the sealing member having light transmitting property and containing a fluorophor, wherein:
a fluorophor-containing area comprising the fluorophor is placed so as to be in contact with faces except a substrate-side lower face out of individual faces forming outer faces of the light emitting element and moreover in contact or out of contact with the substrate-side lower face of the light emitting element,
the fluorophor is excited by emitted light of the light emitting element to emit fluorescent light is longer in wavelength than the emitted light;
the substrate comprises, in its light emitting element-side surface, an overlapping portion coinciding and overlapping with the light emitting element, and grooves are provided outside at least one pair of opposite sides of the overlapping portion, and
the bonding members are placed within the grooves, and the bonding member does not contain the fluorophor.

2. The light emitting device as claimed in claim 1, wherein the bonding member contains the fluorophor and corresponds to part of the fluorophor-containing area, and
the bonding member is in contact with the substrate-side lower face of the light emitting element and side faces of the light emitting element.

3. The light emitting device as claimed in claim 2, wherein the light emitting element is provided in a plurality, and
the plurality of light emitting elements are placed on the single substrate and sealed by the single sealing member.

4. The light emitting device as claimed in claim 3, wherein a distance between adjacent ones of the light emitting elements is 100 μm to 200 μm.

5. The light emitting device as claimed in claim 1, wherein a gold electrode electrically connected to the light emitting element is provided on the substrate.

6. The light emitting device as claimed in claim 1, wherein the substrate has a groove in its face opposed to the light emitting element, the groove having a longitudinal length larger than a length of a bottom face of the light emitting element in the longitudinal direction of the groove and moreover the groove being partly out of coverage with the bottom face of the light emitting element.

7. The light emitting device as claimed in claim 6, wherein the bonding member is placed in the groove.

8. The light emitting device as claimed in claim 1, wherein the overlapping portion of the substrate contains the fluorophor and corresponds to part of the fluorophor-containing area.

9. The light emitting device as claimed in claim 1, wherein a resin which is a component element of the bonding member and a resin which is a component element of the sealing member are equal in refractive index to each other.

* * * * *